United States Patent
Chen et al.

(10) Patent No.: US 9,029,183 B2
(45) Date of Patent: May 12, 2015

(54) METHOD AND APPARATUS FOR IMAGE SENSOR PACKAGING

(71) Applicant: Taiwan Semiconductor Manufacturing Company, Ltd., Hsin-Chu (TW)

(72) Inventors: Szu-Ying Chen, Toufen Township (TW); Tzu-Jui Wang, Fengshan (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/204,921

(22) Filed: Mar. 11, 2014

(65) Prior Publication Data

US 2014/0193940 A1 Jul. 10, 2014

Related U.S. Application Data

(63) Continuation of application No. 13/547,269, filed on Jul. 12, 2012, now Pat. No. 8,710,607.

(51) Int. Cl.
  *H01L 27/146* (2006.01)
  *H01L 23/00* (2006.01)
  *H01L 23/538* (2006.01)
  *H01L 31/18* (2006.01)

(52) U.S. Cl.
  CPC ...... *H01L 27/14636* (2013.01); *H01L 27/1464* (2013.01)

(58) Field of Classification Search
  USPC .......... 257/228, 291, 292, 432, 437, 447; 438/66, 64, 109, 118, 106, 612, 613
  See application file for complete search history.

(56) References Cited

U.S. PATENT DOCUMENTS

| | | | |
|---|---|---|---|
| 6,271,056 B1 * | 8/2001 | Farnworth et al. | 438/106 |
| 6,510,195 B1 | 1/2003 | Chappo et al. | |
| 7,256,474 B2 * | 8/2007 | Wakayama et al. | 257/620 |
| 7,622,364 B2 * | 11/2009 | Adkisson et al. | 438/462 |
| 7,855,442 B2 * | 12/2010 | Magerlein et al. | 257/686 |
| 7,859,033 B2 | 12/2010 | Brady | |
| 7,973,380 B2 | 7/2011 | Hsu et al. | |
| 8,053,900 B2 | 11/2011 | Yu et al. | |
| 8,228,411 B2 | 7/2012 | Dai et al. | |
| 2005/0287695 A1 * | 12/2005 | Rieve et al. | 438/64 |
| 2006/0001180 A1 * | 1/2006 | Taggart et al. | 257/786 |

(Continued)

FOREIGN PATENT DOCUMENTS

| KR | 1020100044100 | 4/2010 |
|---|---|---|
| KR | 1020100105380 | 9/2010 |

*Primary Examiner* — Shaun Campbell
*Assistant Examiner* — Thai T Vuong
(74) *Attorney, Agent, or Firm* — Slater & Matsil, L.L.P.

(57) ABSTRACT

Methods and apparatus for packaging a backside illuminated (BSI) image sensor or a BSI sensor device with an application specific integrated circuit (ASIC) are disclosed. A bond pad array may be formed in a bond pad area of a BSI sensor where the bond pad array comprises a plurality of bond pads electrically interconnected, wherein each bond pad of the bond pad array is of a small size which can reduce the dishing effect of a big bond pad. The plurality of bond pads of a bond pad array may be interconnected at the same layer of the pad or at a different metal layer. The BSI sensor may be bonded to an ASIC in a face-to-face fashion where the bond pad arrays are aligned and bonded together.

20 Claims, 7 Drawing Sheets

(56) References Cited

U.S. PATENT DOCUMENTS

| | | | |
|---|---|---|---|
| 2008/0233733 A1* | 9/2008 | Lin | 438/617 |
| 2009/0185060 A1 | 7/2009 | Akiyama | |
| 2009/0194671 A1 | 8/2009 | Nozaki et al. | |
| 2010/0091163 A1 | 4/2010 | Liao et al. | |
| 2010/0117181 A1* | 5/2010 | Kim et al. | 257/432 |
| 2010/0213560 A1* | 8/2010 | Wang et al. | 257/432 |
| 2010/0238331 A1 | 9/2010 | Umebayashi et al. | |
| 2011/0304008 A1* | 12/2011 | Yang | 257/506 |
| 2012/0080726 A1* | 4/2012 | Sakano | 257/225 |
| 2012/0153419 A1 | 6/2012 | Itonaga et al. | |
| 2012/0293698 A1* | 11/2012 | Sukegawa et al. | 348/294 |
| 2013/0020665 A1* | 1/2013 | Oganesian | 257/432 |

* cited by examiner

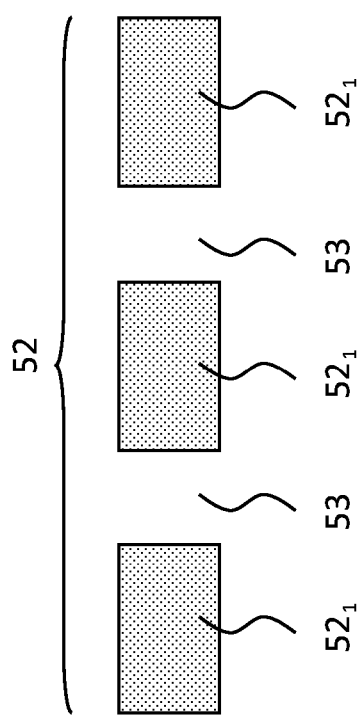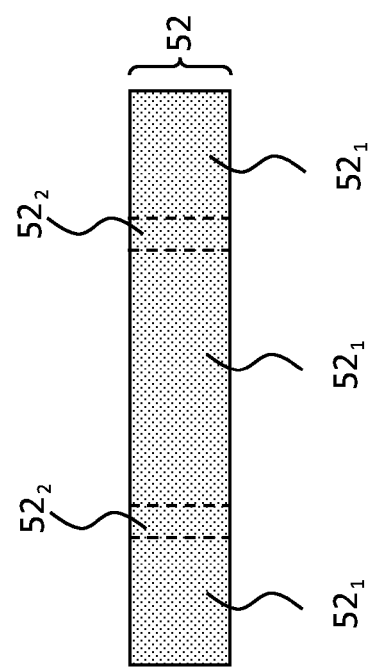
Figure 4(a)
Figure 4(b)

METHOD AND APPARATUS FOR IMAGE SENSOR PACKAGING

This application is a continuation of U.S. application Ser. No. 13/547,269, filed on Jul. 12, 2012, entitled Method and Apparatus for Image Sensor Packaging, which application is hereby incorporated herein by reference.

BACKGROUND

Complementary metal-oxide semiconductor (CMOS) image sensors are gaining in popularity over traditional charged-coupled devices (CCDs). A CMOS image sensor typically comprises an array of picture elements (pixels), which utilizes light-sensitive CMOS circuitry to convert photons into electrons. The light-sensitive CMOS circuitry typically comprises a photo diode formed in a silicon substrate. As the photo diode is exposed to light, an electrical charge is induced in the photo diode. Each pixel may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC).

A CMOS image sensor, or simply a CMOS sensor, may have a front side where a plurality of dielectric layers and interconnect layers are located connecting the photo diode in the substrate to peripheral circuitry, and a backside having the substrate. A CMOS sensor is a front-side illuminated (FSI) image sensor if the light is from the front side of the sensor, otherwise it is a back-side illuminated (BSI) sensor with light incident on the backside. For a BSI sensor, light can hit the photo diode through a direct path without obstructions from the dielectric layers and interconnect layers located at the front side. This helps to increase the number of photons converted into electrons, and makes the CMOS sensor more sensitive to the light source.

Three-dimensional (3D) integrated circuits (ICs) may be used to achieve a high density required for current applications, such as image sensor applications. When a CMOS sensor is packaged in a 3D IC, a CMOS sensor and its related ASIC may be bonded to a carrier wafer in parallel, which may take a larger area for the carrier wafer. Therefore there is a need for methods and systems to reduce the package area for CMOS sensors bonded to related ASICs.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 4(a)-4(b) illustrate top views for bond pads within a bond pad array of a CMOS sensor;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure discloses methods and apparatus for packaging a backside illuminated (BSI) image sensor or a BSI sensor device with an application specific integrated circuit (ASIC). According to an embodiment, a bond pad array may be formed in a BSI sensor where the bond pad array comprises a plurality of bond pads electrically interconnected, wherein each bond pad of the bond pad array is of a small size which can reduce the dishing effect of a big bond pad. The plurality of bond pads of a bond pad array may be interconnected at the same layer of the pad or at a different metal layer. The BSI sensor may be bonded to an ASIC in a face-to-face fashion where the bond pad arrays are aligned and bonded together.

Figure 1A:
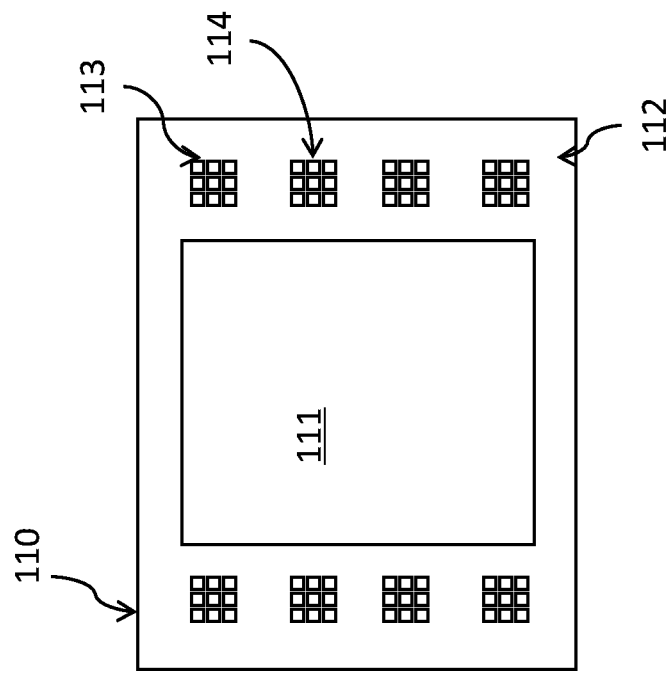
FIGS. 1(a) and 1(b) illustrate a view of the top side of a CMOS sensor, and an ASIC, with a plurality of bond pad arrays.

FIG. 1(a) illustrates a surface view of the top side of a CMOS sensor 10, or a sensor 10. The sensor 10 may be made up of millions of components such as active devices and passive devices. The sensor may comprise an active area 11 and a bond pad area 12 where a plurality of bond pad arrays such as 13 and 14 are located. Some other forms of bond pads may exist in the bond pad area 12 as well. The active region 11, containing the majority of the high density, active circuitry of the CMOS sensor 10, may be located in a relative center area of the sensor 10.

A plurality of bond pad arrays such as 13 and 14 are located along the periphery of the CMOS sensor 10. A bond pad array 13 or 14 may comprise a plurality of bond pads. As shown in FIG. 1(a), the bond pad array 13 comprises a total of nine bond pads arranged as a 3*3 matrix format, including a first bond pad 13_1, and a second bond pad 13_2, which are separated from one another. The bond pad 13_1 and 13_2 are electrically connected together with each other and with other remaining bond pads within the bond pad array 13. The interconnection between the bond pads within a bond array 13 may be made in various ways, such as in a metal layer below the top surface. The bond pad array 13 is further separated from another bond pad array 14 by a larger distance compared to the distance between bond pads within the same bond array. The bond pads within the bond pad array 14 are connected electrically together, but are electrically isolated from the bond pads within the bond pad array 13. The number of bond pad arrays 13 and the number of bond pads within a bond pad array are for illustrative purposes only and are not limiting. There may be other numbers of bond pad arrays, and each bond pad array may comprise a different number of bond pads.

Figure 1B:
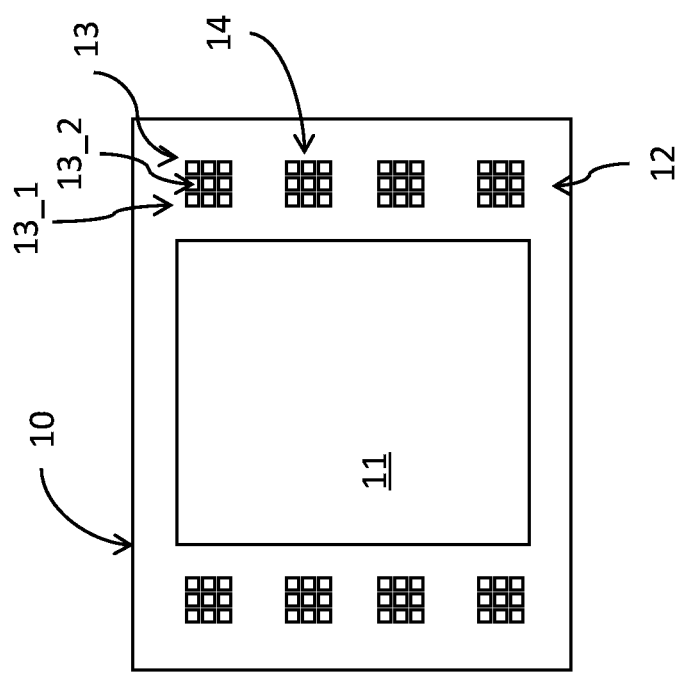

Similarly, a view of the top side of an application specific integrated circuit (ASIC) 110 is shown in FIG. 1(b). The ASIC 110 may be related to the sensor 10 to process digital or analog signals generated by the sensor 10. The ASIC 110 may be made up of millions of components such as active devices and passive devices. These components are initially isolated from each other, formed on an underlying silicon substrate, and are later interconnected together by metal interconnect lines to form the functional circuit. Typical interconnect structures include lateral interconnections, such as metal lines or wirings, and vertical interconnections, such as vias and contacts. The side of the silicon substrate on which the integrated circuit is formed may be referred to as the top side or the front side of the ASIC 110. The ASIC 110 may be referred to as an integrated circuit device, a circuit, a device, a circuit device, a die, or in any other terms known to those skilled in the art.

As illustrated in FIG. 1(b), bond pad arrays 113 and 114 are located in the bond pad area 112 along the periphery of the ASIC 110. In the center of the integrated circuit device 110 is the active region 111 containing the majority of the high density, active circuitry of the ASIC 110. The ASIC 110 may further be surrounded by a guard ring region, placed outside of bond pad arrays 113 that protects the ASIC 110, not shown.

The bond pad arrays 13 in FIGS. 1(a) and 113 in FIG. 1(b) may function to supply data, retrieve data, test a device, and supply various voltages for testing or programming. An exemplary bond pad array comprises a test mode bond pad array not connected to and separate from an operational mode bond pad array. When the test sequence is complete, the test mode of the test mode bond pad array is disabled. The two bond pad arrays are then connected during wire bonding, and the resulting joined bond pad arrays function in an operational mode.

The sensor 10 and the ASIC 110 may be bonded together by a method such as adhesive bonding, direct copper bonding, or direct oxide bonding. If the direct copper bonding is used, the sensor 10 and the ASIC 110 are bonded by applying a high pressure, so that the bond pad arrays 13 of the sensor 10 and the bond pad arrays 113 of the ASIC 110 which may be copper pads, are bonded together. By directly bonding the sensor IC 10 and the ASIC 110 together, a conventional carrier wafer is not needed, therefore decreasing die area and cost.

Traditionally, some large bond pads may be used in bonding the sensor 10 and the ASIC 110. For example, one large bond pad may be used instead of the bond pad array 13. These large bond pads suffer from problems. In the formation of large bond pads, chemical mechanical polish (CMP) processes typically involved. As a result, during the CMP processes for forming large bond pads, a dishing effect occurs, which causes the center regions of bond pads to be polished more than the edge regions. The dishing effect may adversely affect the reliability of the bonding. With the dishing effect, only small portions of bond pads are bonded to each other, and hence the bonding is less reliable. Moreover, the current that may reliably flow through the bonded area is reduced due to the reduced bond area. A bond pad array 13 comprising a plurality of smaller bond pads as shown in FIG. 1(a) can reduce or eliminate such problems.

Figure 2A:
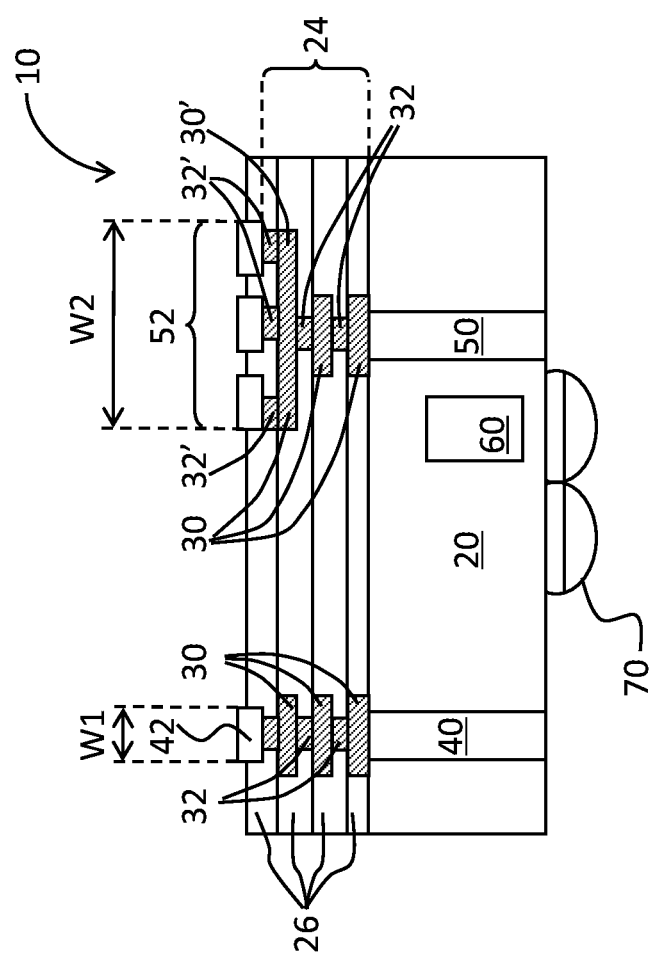
FIGS. 2(a)-2(b) illustrate methods and apparatus for connecting bond pads within a bond pad array of a CMOS sensor.

FIG. 2(a) illustrates a CMOS sensor 10, which is a portion of a wafer. The CMOS sensor 10 includes a semiconductor substrate 20 with a front side and a backside. The substrate 20 may be formed of commonly known semiconductor materials such as silicon, silicon germanium, or the like. The sensor 10 may comprise a grid or array of pixel regions or sensor elements formed on the substrate 20. One such a sensor element or a pixel region 60 is shown in FIG. 2(a) as an example.

The pixel region 60 may comprise a photosensitive diode, sometimes referred to as a photo diode, which may generate a signal related to the intensity or brightness of light that impinges on the photosensitive diode. The photosensitive diode may be a pinned layer photo diode comprising a p-n-p junction. A non-pinned layer photo diode may alternatively be used. Any suitable photo diode may be utilized with the embodiments, and all of these photo diodes are intended to be included within the scope of the embodiments. The pixel region 60 may further comprise a transistor, which may be a transfer transistor, a reset transistor, a source follower transistor, or a select transistor. The transistor may comprise a gate dielectric adjacent the substrate, a gate electrode over the gate dielectric, and spacers along the sidewalls of the gate dielectric and gate electrode.

The substrate 20 may further comprise a plurality of isolation areas, not shown, to separate and isolate various devices formed on the substrate, and also to separate the pixel regions from other logic regions of an image sensor.

On the backside of the substrate 20, a micro-lens and a color filter element 70, may be formed on a dielectric layer over the backside of the substrate 20 for color imaging applications. The micro-lens lenses may be located between the color filter and the backside of the substrate, such that the backside-illuminated light can be focused on the light-sensing regions. The micro-lens converges light illuminated from the backside of the substrate to the photo diode. Associated with each of the color filter elements is a corresponding micro-lens. The color filter elements and associated micro-lenses may be aligned with the photosensitive elements of the sensor layer using alignment marks.

On the front side of the substrate 20, more integrated circuits such as transistors and other devices such as capacitors, resistors, and the like, not shown, may be formed. An interconnect structure 24 may be formed over the devices. The interconnect structure 24 may include a plurality of dielectric layers 26, including, but not limited to, inter-metal dielectrics (IMD), passivation layers, and the like. The IMDs 26 may be formed of low-k dielectric materials with k values less than, for example, about 2.5. Metal lines 30 and vias 32 are formed in the plurality of dielectric layers 26, and may be formed of copper using the well-known damascene process, or formed of other metals such as aluminum, tungsten, silver, or the like.

Interconnect structure 24 interconnects the underlying integrated circuits, and connects the integrated circuits to respective bond pad 42 and bond pad array 52, which are formed on the front side of the substrate 20. The bond pad 42 may be formed in the active area 11 or in the bond pad area 12 and bond pay array 52 may be any of the bond pad arrays 13 or 14, or others shown in the bond pad area 12 in FIG. 1(a). The bond pad 42 may have a smaller size in width W1 compared to the overall size W2 of the area covered by the bond pad array 52. For example, the W2 may be in a size about several-ten um~100 um. Throughout the entire sensor 10, and possibly the entire wafer, a threshold lateral dimension is predetermined, and any bond pad with a lateral dimension (either width and/or length) greater than the threshold lateral dimension will have a bond pad array form as shown in the bond pad array 52, while any bond pad having lateral dimensions (width and/or length) less than the threshold lateral dimension will be one solid bond pad as the bond pad 42. For example, a predetermined dimension of a size 20 um may serve as a threshold that any pad has a size of 20 um or over, which could be a width or a length of the pad, may be formed as a bond pad array, otherwise it can be formed as a single pad.

There are only 3 bond pads shown in the bond pad array 52. There may be other number of bond pads within the bond pad array 52. Each bond pad within the bond pad array 52 is connected electrically to each other so that the bond pad array 52 functions as one contact, sometimes, it may be referred to as a patterned bond pad 52. A bond pad within the bond pad array 52 may be of a similar size, in a range about 5-20 um width and length. A first bond pad within the bond pay array 52 may be separated from its neighboring bond pad by a distance in a range about 5-20 um.

The electrical connections between bond pads within the bond pad array 52 are made through metal line 30' and vias 32'. Metal line 30' and vias 32' may be in the metallization layer (or inside the passivation layer) immediately underlying bond pad 52, which may be a top metallization layer (commonly referred to Mtop) or a redistribution layer. Alternatively, the electrical interconnection between the bond pads within the bond pad array 52 may be provided in any of the underlying metallization layers ranging from the bottom metallization layer (commonly referred to as M1) to the top metallization layer Mtop.

Through vias (TV) 40 and 50 extend through substrate 20, and interconnect the features on the front side to the backside of substrate 20. Through vias 40 and 50 may be, for example through silicon vias, through oxide vias, or the like. Generally, as noted above, the substrate 20 may comprise a variety of materials, such as a silicon substrate, an oxidized substrate, or the like. Through vias 40 and 50 represent vias extending through the substrate 20. TV 40 is electrically connected to bond pad 42, and TV 50 is electrically connected to bond pad array 52. Accordingly, bond pad 42 and TV 40 may be used to carry a relatively small current, for example, a signal current, while bond pad array 52 and TV 50 may be used to carry a relatively great current, for example, a power supply current. Bond pad 42 may be electrically disconnected from bond pad array 52.

Figure 2B:
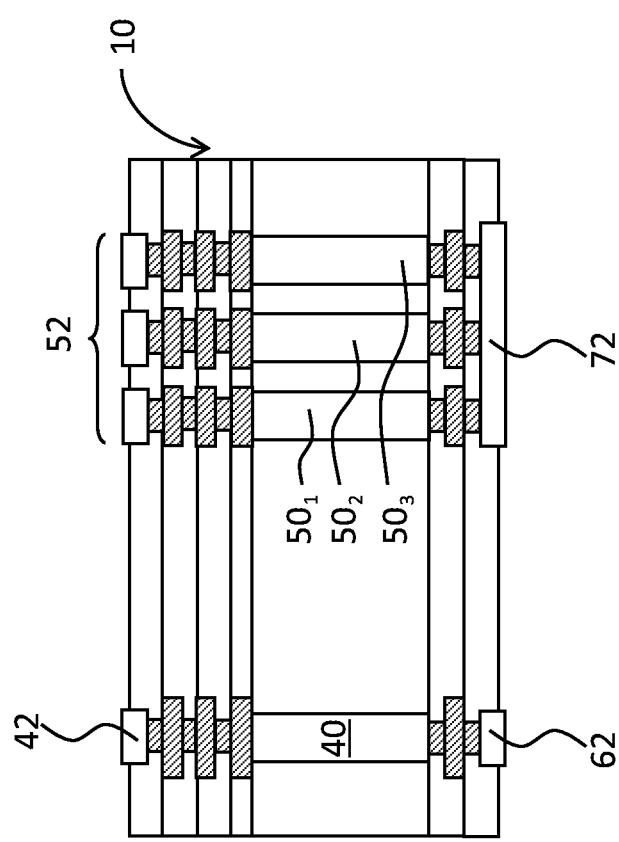

FIG. 2(b) illustrates an alternative embodiment where the bond pads within the bond pad array 52 are connected together at the backside of the substrate 20. On the backside of sensor 10, bond pads 62 and 72 may be formed. Instead of using one TV to interconnect features on opposite sides of substrate 20, more than one TV $50_1$, $50_2$, and $50_3$ may electrically interconnect the bond pad array 52 to a bond pad 72 at the backside of the substrate. In an embodiment, bond pads 62 and 72 have the specification similar to that of bond pad 42 and bond pad array 52, respectively. Accordingly, bond pad 72 may be larger than bond pad 62.

Figure 3B:
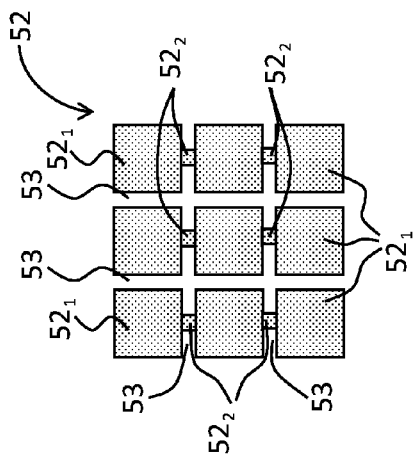
FIGS. 3(a)-3(d) illustrate methods and apparatus for the configurations of bond pads within a bond pad array of a CMOS sensor.
Figure 3D:
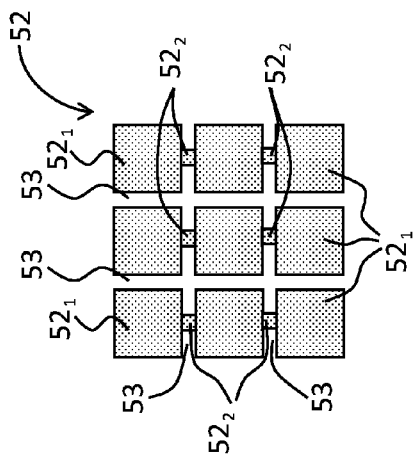
Figure 3A:
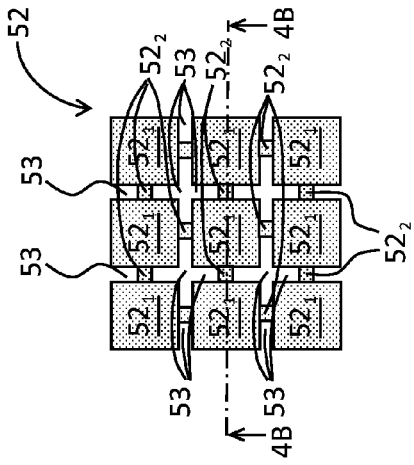

FIGS. 3(a)-3(d) are top views of several possible designs of bond pad array 52 or 72 as shown in FIG. 2(a) and FIG. 2(b). Both FIGS. 3(a) and 3(b) show bond pad array 52 including a bond pad $52_1$ separated by openings 53, and interconnection $52_2$ for connecting to the bond pad $52_1$. Interconnection $52_2$ are also in the same layer as the bond pad $52_1$.

Figure 3C:
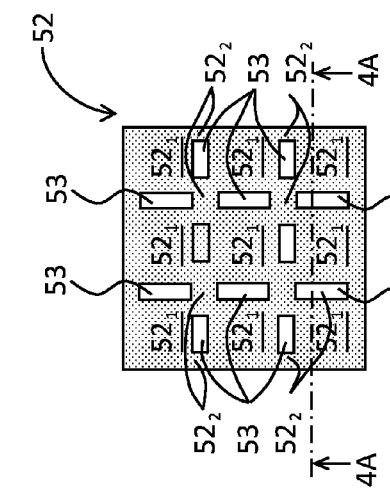

On the other hand, FIG. 3(c) illustrates another embodiment in which the bond pad array 52 includes a plurality of discrete bond pads $52_1$ separated by openings 53. In the layer in which the bond pad array 52 is located, there is no electrical connection between discrete bond pad $52_1$. Electrical connections are provided through the underlying vias and metal lines, just as metal line 30' and vias 32' shown in FIG. 2(a). With the structure shown in FIGS. 3(a)-3(c), the bond pad array 52 acts as an integrated bond pad, meaning that the connection to any of the bond pad $52_1$ is equivalent to the connection to other bond pads within the bond pad array.

Combination schemes may be formed to include both the embodiments shown in FIGS. 3(a)-3(b), and the embodiment shown in FIG. 3(c). In the combination schemes, some of the bond pads $52_1$ are interconnected through interconnection $52_2$ as groups, while different groups of the interconnected $52_1$ are disconnected from each other. An exemplary embodiment is shown in FIG. 3(d), in which each column of bond pads $52_1$ are interconnected, while the columns are discrete.

Again, there will be at least one underlying via 32' connected to each of the columns, and the vias 32' are interconnected, as shown in FIG. 2(a).

Openings 53, as shown in FIGS. 3(a) through 3(d), may at least partially be filled with a dielectric material. Referring to FIG. 2(a), at least lower portions of openings 53 are filled with the material of the top one of the plurality of dielectric layers 26.

In the case the embodiments as shown in FIG. 3(a)-3(b) are adopted, there may be more than one via 32' connected to the bond pads $52_1$, as shown in FIG. 2(a). Alternatively, since bond pads $52_1$ are already interconnected, there may be only one via 32' shown in FIG. 2(a) formed and connected to only one of the bond pads $52_1$, as shown in FIGS. 3(a)-3(b). However, in the case the embodiments as shown in FIGS. 3(c)-3(d) are adopted, each of the discrete bond pad $52_1$ has to have an underlying via 32' connected to it. Otherwise, the ones without the connecting vias 32' will not be able to connect with other bond pads.

Depending on where the cross-sectional view as shown in FIG. 2(a) is obtained, the cross-sectional view of bond pad array 52 may appear as solid bonds as shown in FIG. 4(a), or appear as one continuous pad as indicated by FIG. 4(b), wherein FIG. 4(a) may be the cross-sectional view taken along a plane crossing line 4A-4A in FIG. 3(a), while FIG. 4(b) may be the cross-sectional view taken along a plane crossing line 4B-4B in FIG. 3(b).

Figure 5:
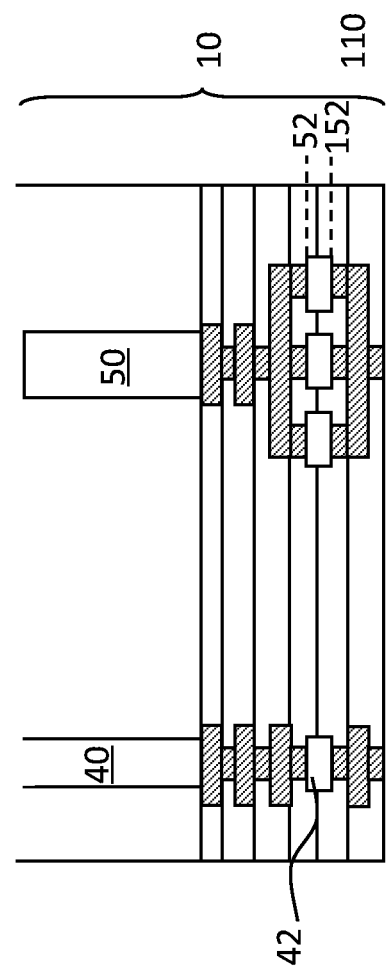
FIG. 5 illustrates a cross-section view of the bonding of a CMOS sensor and an ASIC.

FIG. 5 illustrates a face-to-face bonding of a sensor 10 and an ASIC chip 110. The ASIC chip 110 may have a same or a different structure as that shown in FIGS. 2 through 4. Advantageously, by adopting the embodiments of the present disclosure, bond pad arrays 52 and 152 may be formed without the concern that the dishing effect may occur, and hence the resulting bonding is more reliable, and can conduct greater currents. The bond pad array 152 is formed on a bond pad area of the ASIC 110, at the front side of the substrate of the ASIC. The bond pad array 152 comprises three bond pads as illustrated in FIG. 5, separated by openings between each other. There may be other number of bond pads within the bond pad array 152. The bond pad of the bond pad array 152 is directly bonded and connected to the bond pad of the bond pad array 52, in a one-to-one fashion as shown in FIG. 5. While this may be the preferred fashion for bonding the sensor 10 and the ASIC 110 together, other forms of bonding may be possible. For example, the bond pad array 152 may have a different configuration from the bond pad configuration of the bond pad array 52. The bonding of the bond pad array 52 and the bond pad array 152 may be formed on one of the bond pad for each bond pad array, such as a first bond pad of the bond pad array 52 and a third bond pad of the bond pad array 152 are bonded together, or in addition, a second bond pad of the bond pad array 52 and a fourth bond pad of the bond pad array 152 are bonded together.

Figure 6A:
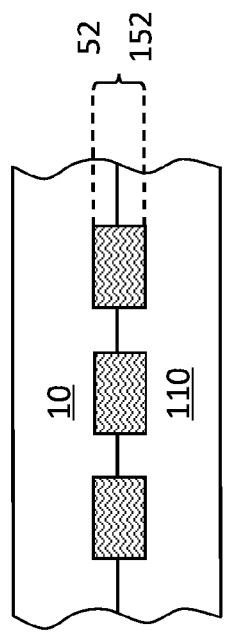
FIGS. 6(a)-6(c) illustrate a cross-section view of the bonding of a bond pad array of a CMOS sensor and a bond pad array of an ASIC.
Figure 6B:
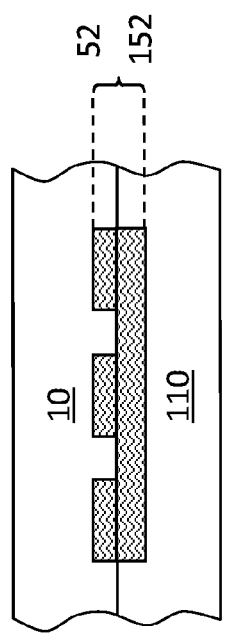
Figure 6C:
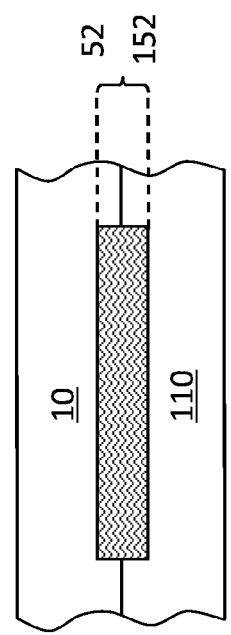

FIGS. 6(a)-6(c) illustrate three possible cross-sectional views of the bonding between the bond pad arrays 52 and 152, wherein the different views are the results of taking cross-sectional views at different positions, such as the one shown in FIGS. 4(a) and 4(b), and/or the results of forming bond pad arrays 52 and 152 with the same or different structures.

In the disclosed structure of the sensor 10, the illuminated light during applications may not be limited to a visual light beam, but can be extended to other optical light such as infrared (IR) and ultraviolet (UV), and other proper radiation beams.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming an integrated circuit (IC) package:
   disposing a photosensitive diode within an active area of a substrate; and
   forming a first bond pad array at a front side of the substrate, wherein the first bond pad array comprises a first bond pad and a second bond pad separated by an opening, and wherein the first bond pad and the second bond pad are configured to directly connect to an external connector; and
   electrically connecting the first bond pad to the second bond pad, wherein every electrical component connected to the first bond pad is also electrically connected to the second bond pad.

2. The method of claim 1, wherein the first bond pad array further comprises additional bond pads, wherein all the additional bond pads are electrically connected to each other and to the first bond and the second bond pad.

3. The method of claim 1, further comprising filling at least a portion of the opening separating the first bond pad and the second bond pad with a dielectric material.

4. The method of claim 1, wherein disposing the photosensitive diode comprises disposing a pinned layer photo diode comprising a p-n-p junction within the active area of the substrate.

5. The method of claim 1, further comprising disposing a micro-lens and a color filter on a backside of the substrate.

6. The method of claim 1, wherein electrically connecting the first bond pad to the second bond pad comprises electrically connecting the first bond pad and the second bond pad in a same layer as the first bond pad and the second bond pad.

7. The method of claim 1, wherein electrically connecting the first bond pad to the second bond pad comprises electrically connecting the first bond pad and the second bond pad in a different layer than the first bond pad and the second bond pad.

8. The method of claim 1, wherein the first bond array comprises an additional bond pad, and wherein the method further comprises electrically connecting the additional bond pad to the first bond pad in a same layer as the first bond pad and the additional bond pad.

9. The method of claim 1, further comprising forming a second bond pad array on a backside of the substrate, wherein the second bond pad array is electrically connected to the first bond pad array.

10. A method for forming an integrated circuit package comprising:
    forming a first bond pad array at a front side of a first substrate, wherein the first bond pad array comprises a first bond pad and a second bond pad separated by an opening; and
    electrically connecting the first bond pad to the second bond pad, wherein every electrical component connected to the first bond pad is also electrically connected to the second bond pad;
    providing a second bond pad array at a front side of a second substrate, wherein the second bond pad array comprises a third bond pad and a fourth bond pad separated by an opening; and
    bonding the first bond pad array directly to the second bond pad array, wherein the first bond pad and the third bond pad are bonded together.

11. The method of claim 10, wherein bonding the first bond pad array directly to the second bond pad array comprises bonding the second bond pad and the fourth bond pad together.

12. The method of claim 10, wherein the third bond pad and the fourth bond pad are electrically connected together, wherein every electrical component connected to the third bond pad is also electrically connected to the fourth bond pad.

13. The method of claim 10, further comprising disposing a photosensitive diode within an active area of the first substrate.

14. A method for forming an integrated circuit package comprising:
    providing a sensor device comprising:
      a photosensitive diode within an active area of a first substrate; and
      a first bond pad array at a front side of the first substrate, wherein the first bond pad array comprises a first bond pad and a second bond pad separated by an opening and electrically connected to each other, and functioning as one electric contact;
    providing an application specific integrated circuit (ASIC) chip comprising a second bond pad array at a front side of a second substrate, wherein the second bond pad array comprises a third bond pad and a fourth bond pad separated by an opening and electrically connected to each other, and functioning as one electric contact; and
    bonding the first bond pad array to the second bond pad array, wherein the first bond pad and the third bond pad are bonded directly together.

15. The method of claim 14, wherein bonding the first bond pad array to the second bond pad array comprises bonding the second bond pad and the fourth bond pad directly together.

16. The method of claim 14, wherein the photosensitive diode of the sensor device is a pinned layer photo diode comprising a p-n-p junction.

17. The method of claim 14, wherein the sensor device further comprises a micro-lens and a color filter on a backside of the first substrate.

18. The method of claim 14, wherein first bond pad and the second bond pad are electrically interconnected in a same layer in which are formed the first bond pad and the second bond pad.

19. The method of claim 14, wherein first bond pad and the second bond pad are discrete, formed in a first layer, and are electrically connected by an element formed in a different layer.

20. The method of claim 14, wherein the sensor device further comprises a through via connected to the first bond pad array.

* * * * *